(12) United States Patent
Huang et al.

(10) Patent No.: US 6,858,944 B2
(45) Date of Patent: Feb. 22, 2005

(54) BONDING PAD METAL LAYER GEOMETRY DESIGN

(75) Inventors: Tai-Chun Huang, Kaohsiung (TW); Tze-Liang Lee, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/284,715

(22) Filed: Oct. 31, 2002

(65) Prior Publication Data

US 2004/0084779 A1 May 6, 2004

(51) Int. Cl.[7] .............................................. H01L 23/48
(52) U.S. Cl. ...................... 257/786; 257/773; 257/774; 257/775; 257/784
(58) Field of Search ................................. 257/786, 773, 257/774, 775, 784; 438/612, 613, 615, 617

(56) References Cited

U.S. PATENT DOCUMENTS

| | | | |
|---|---|---|---|
| 5,985,765 A | 11/1999 | Hsiao et al. | |
| 6,087,732 A | 7/2000 | Chittipeddi et al. | |
| 6,165,886 A | * 12/2000 | Lin et al. | 438/612 |
| 6,181,016 B1 | * 1/2001 | Lin et al. | 257/786 |
| 6,306,749 B1 | * 10/2001 | Lin | 438/612 |
| 6,313,541 B1 | 11/2001 | Chan et al. | |

* cited by examiner

*Primary Examiner*—Eddie Lee
*Assistant Examiner*—Thomas Magee
(74) *Attorney, Agent, or Firm*—Duane Morris LLP

(57) ABSTRACT

A bonding pad suitable for use in wire bonding an integrated circuit includes an approximately rectangular metal pattern. The bonding pad has at least one slot or hole in it, located at or adjacent to at least one corner of the approximately rectangular metal pattern. The slot or hole provides peeling stress relief.

33 Claims, 16 Drawing Sheets

BONDING PAD METAL LAYER GEOMETRY DESIGN

FIELD OF THE INVENTION

The present invention relates to semiconductor packages generally, and more specifically to bonding pads for wire bonding.

BACKGROUND OF THE INVENTION

During the fabrication of an integrated circuit package, a die containing a plurality of circuit patterns is connected to an integrated circuit package substrate. The package substrate has a plurality of pins for connecting the circuitry to an external printed wiring board.

The most common method for forming electrical connections between the die and the package substrate is wire bonding. A plurality of bonding pads is located around the perimeter on a top surface of the die. A corresponding set of contacts is located on the package substrate. A plurality of connecting wires are bonded to connect each bonding pad to a respective contact on the package substrate, using a method such as ultrasonic bonding. Following wire bonding, the package is encapsulated and sealed.

Traditional bonding pads have the same shape as the first metal layer (M1). Typical bonding pads in the prior art have solid metal pads, in a rectangular or square configuration. In this type of pad, the bonding pad corner has a high stress concentration and often peels or lifts up during wire bonding. In addition to pad peeling, interface peeling, pad carpeting and inter-metal dielectric (IMD) cracking may occur. This has an unfavorable effect on yield.

Prior attempts to reduce the stress concentration at the corners of the bonding pad have included use of rounded corners and beveled corners that give the bonding pad an octagonal shape. Other techniques for reducing peeling have included increasing the corner adhesion by surface treatments or increasing the contact area. U.S. Pat. No. 6,313,541 is incorporated by reference herein for its teachings on a structure for reducing peeling in a bond pad through formation of dendritic sub-structures in a dielectric layer surrounding the bonding pad.

An improved bonding pad is desired.

SUMMARY OF THE INVENTION

A bonding pad suitable for use in wire bonding an integrated circuit includes an approximately rectangular metal pattern. The bonding pad has at least one slot or hole therein at or adjacent to at least one corner of the approximately rectangular metal pattern, the slot or hole providing peeling stress relief.

DETAILED DESCRIPTION

The present invention is embodied in a bonding pad, an integrated circuit package including the bonding pad, and a method for forming an integrated circuit package using the bonding pad. The exemplary bonding pads reduce corner stress and increase adhesion against pad peeling.

Figure 1A:
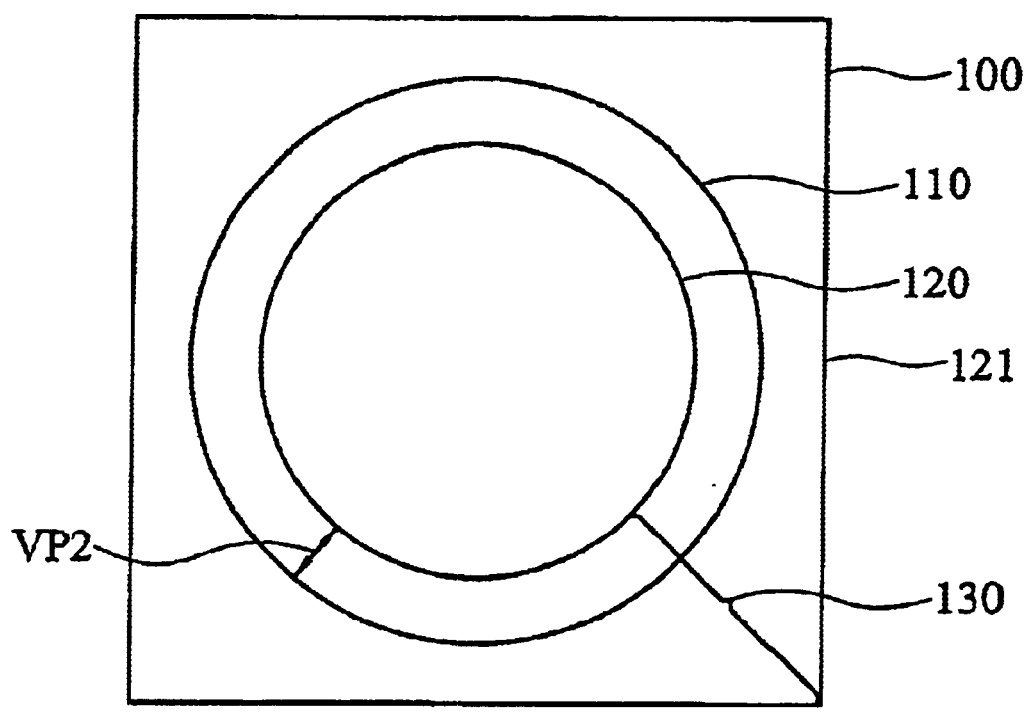
FIGS. 1A and 1B are diagrams of a bonding pad according to the present invention.

FIG. 1A shows an exemplary bonding pad 100. The bonding pad 100 has a wire bond ball area 110. An inner or central portion 120 of the bonding pad 100 is designated as a solid pattern area. A solid pattern of metal is deposited in region 120. The region 130 between the circumference of the solid pattern area 120 and the perimeter 121 of the bonding pad 100 is designated as a slot/hole area, in which a plurality of slots or holes are formed in the bonding pad metal. The slot/hole area 130 has a minimum dimension of at least VP2, where VP2 is twice the minimum pitch between vias (best seen in FIG. 1B).

Figure 1B:
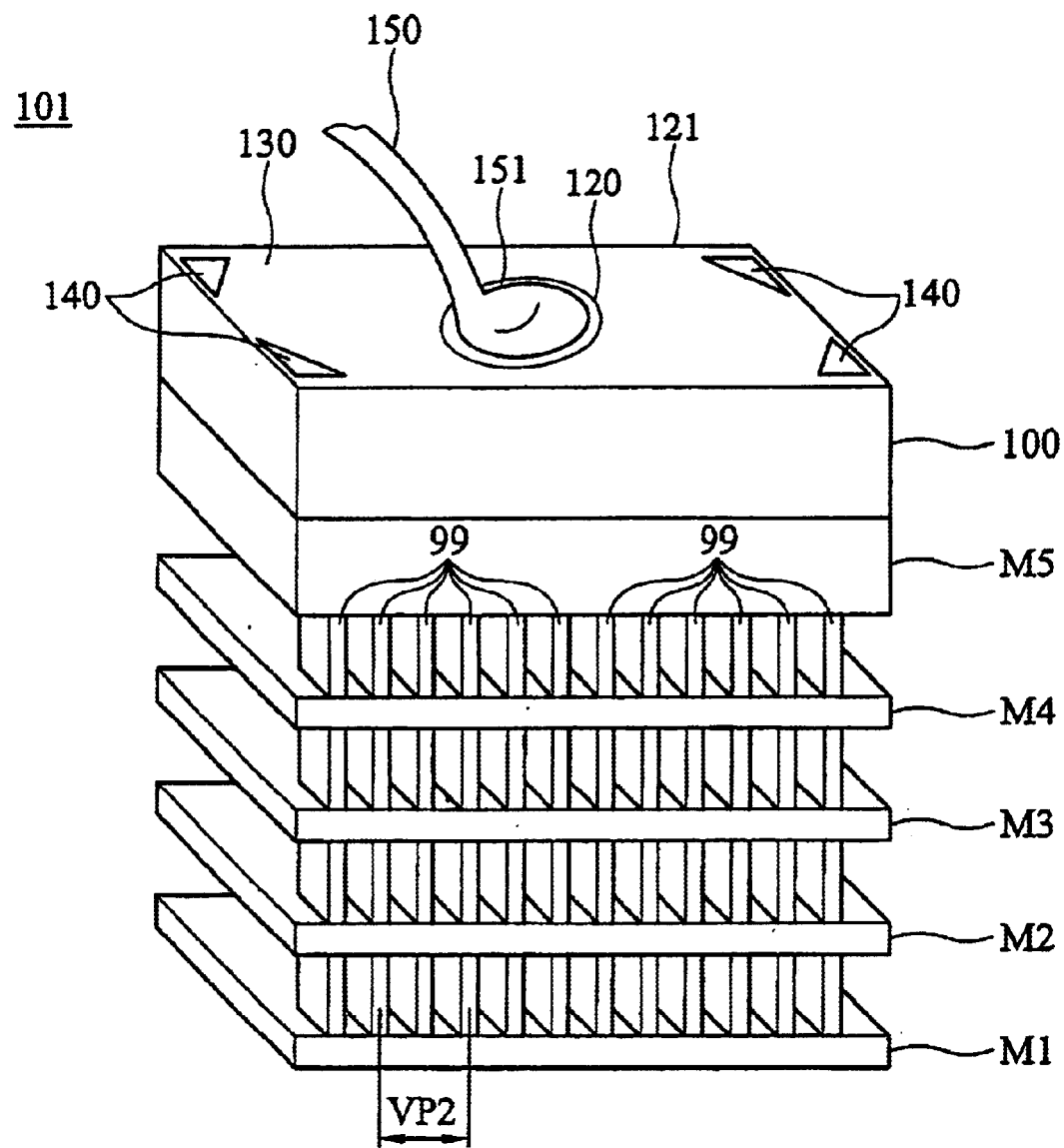

FIG. 1B shows a representative set of layers in a semiconductor integrated circuit device 101. A plurality of metal layers M1–M5 is shown. The circuit patterns in layers M1–M5 are connected to patterns in other layers by way of conductive vias 99. A wire 150 of a metal such as gold, with a wire bond ball 151, is bonded to the bonding pad 100, using a wire-bonding machine. FIG. 1B shows the distance VP2 that is twice the minimum pitch between vias 99. FIG. 1B also shows a pattern of holes or slots 140 between the central portion 120 and the perimeter 121 of the bonding pad 100.

Figure 2:
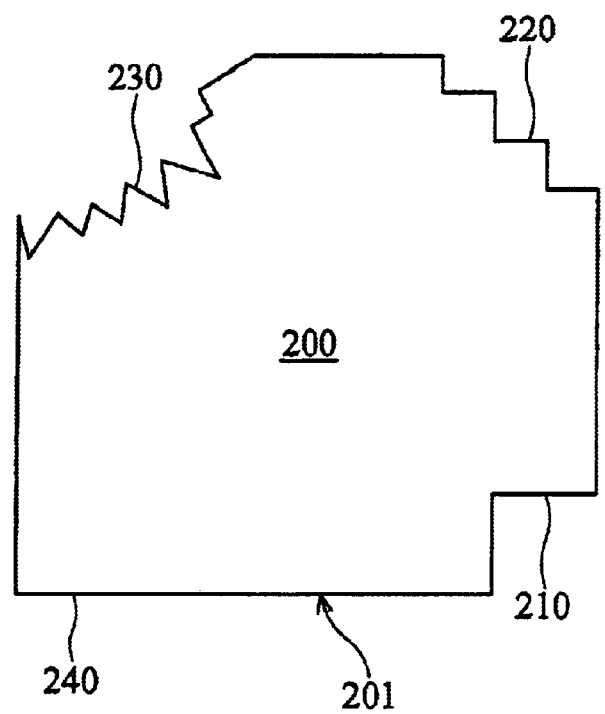
FIGS. 2 to 21 show various embodiments of the bonding pad of FIG. 1.
Figure 16:
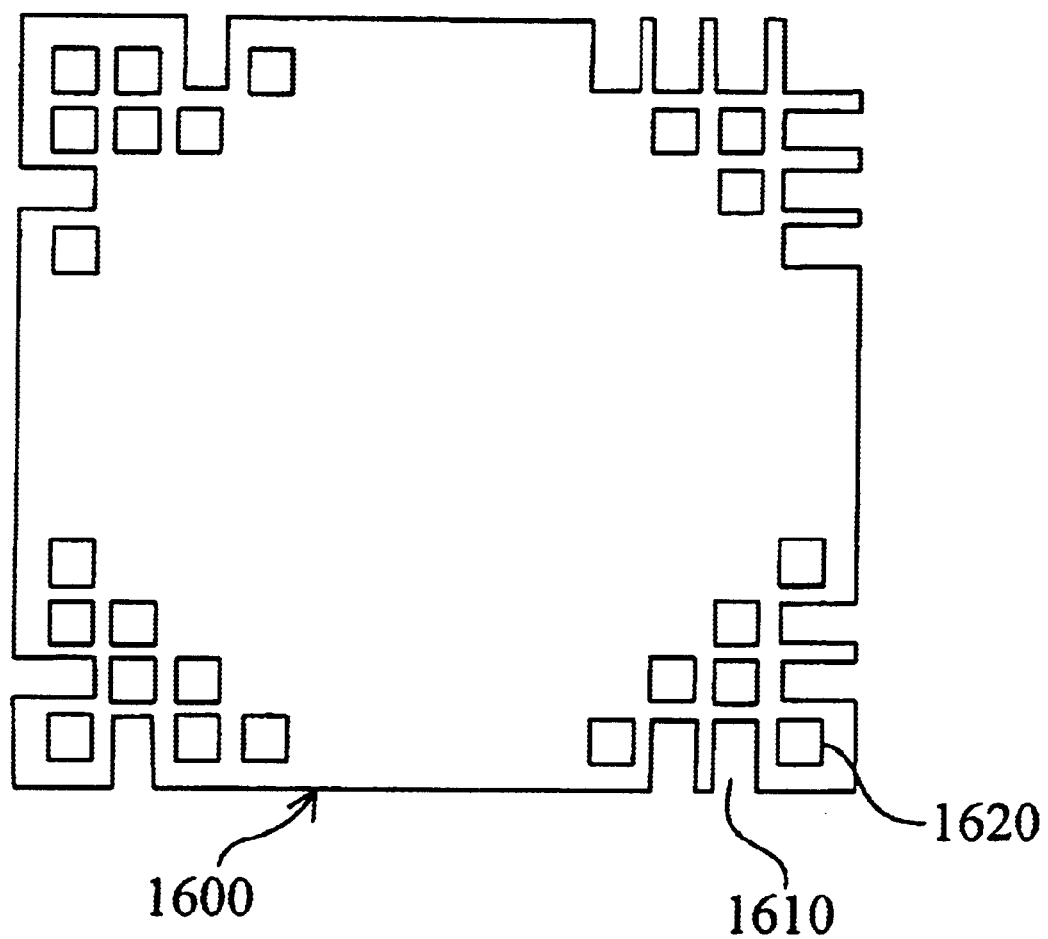

FIG. 2 shows an exemplary bonding pad 200 suitable for use in wire bonding an integrated circuit. The bonding pad 200 includes an approximately rectangular metal pattern 201. The approximately rectangular pattern may be a square or a more general rectangle having a length that differs from its width. The approximately rectangular pattern 201 may also have one or more corners that are rounded or corners that are beveled. In addition, the approximately rectangular pattern 201 has at least one slot or hole 210, 220, 230 therein at or adjacent to at least one corner of the approximately rectangular metal pattern. An "interlock" type geometry may be used to define the pad corner. (An example of an interlock geometry is shown in FIG. 16. The edge of the pad near the corner has slots that receive the IMD.) The slot or hole provides peeling stress relief. The IMD materials inside the slots or holes on the pads can "interlock" with the metal on the pads from the same layer or from above or below. In other configurations (e.g., FIGS. 8 and 9), an interlocking radial slot in the corner receives the IMD. The slot or hole may have any of a large variety of shapes and forms, of which several non-limiting examples are shown and described herein.

Referring again to FIG. 2, in some embodiments, referred to generally herein as open slots or open holes, the at least one opening in the metal pattern reaches all the way to at least one corner or at least one side of the approximately rectangular metal pattern. The open slot or hole is not limited to elongated linear pattern elements, but may have any shape. For example, hole 210 is a square open hole located at one corner of pattern 201. Open hole 220 is a step-shaped pattern that is located at another corner of pattern 201. Open hole 230 is a star-burst pattern located at a third corner of pattern 201. The open slots/holes in bonding pad 200 extend from the at least one corner inward towards an interior or center of the bonding pad.

Figure 3:
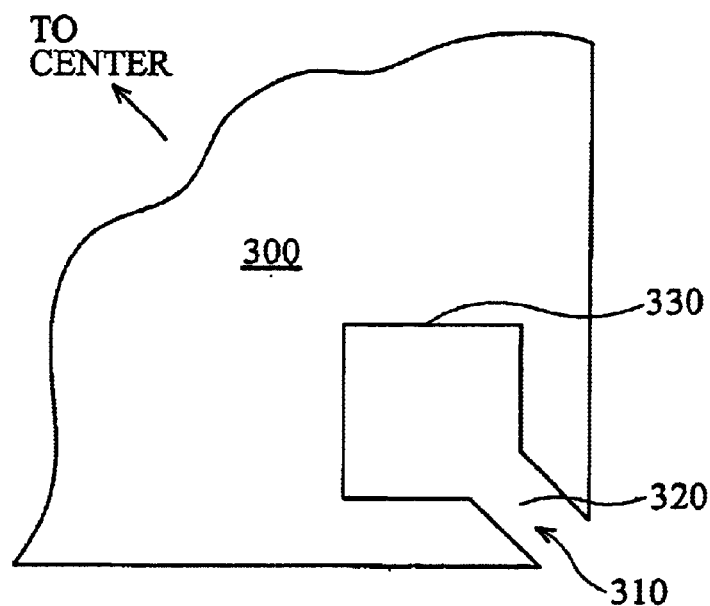

FIG. 3 shows a corner of another bonding pad 300 having open slot pattern 310 in at least one corner thereof. The pattern 310 includes a relatively large opening 330 connected to the corner of the bonding pad 300 by a narrow connecting slot. The remaining three corners of bonding pad 300 may have the same open slot pattern or a different pattern.

Figure 4:
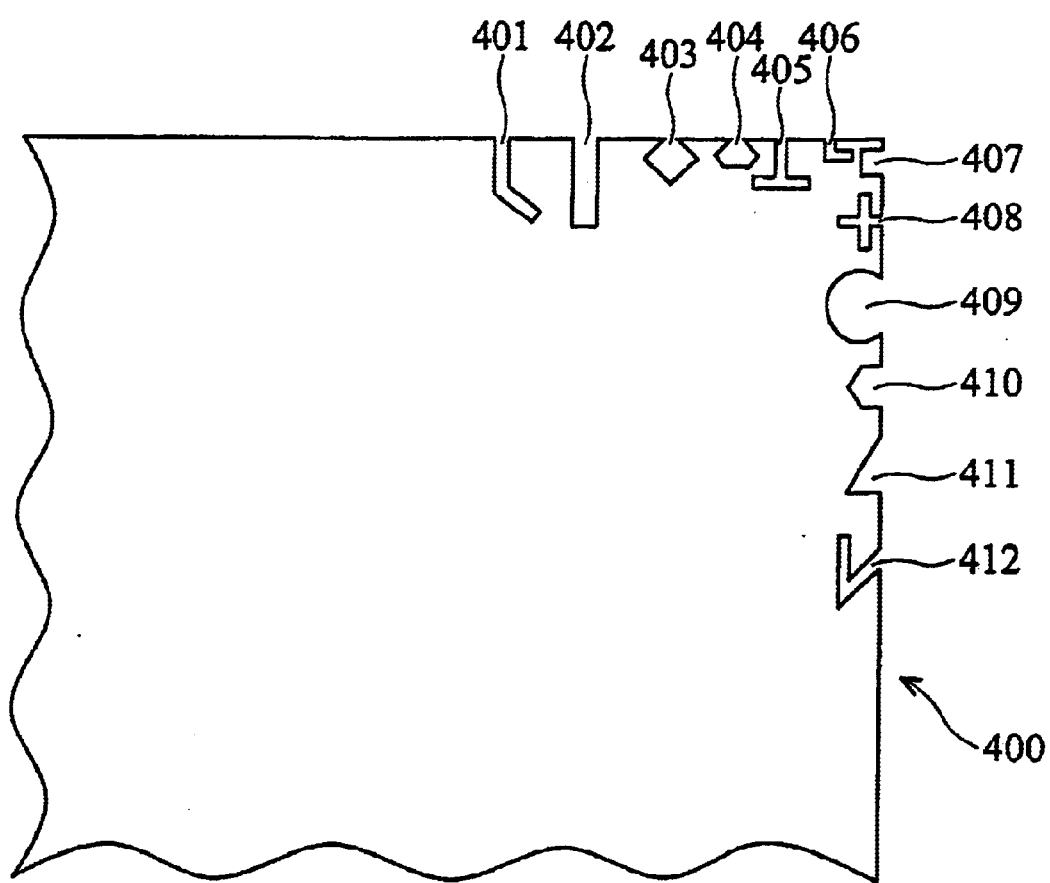

FIG. 4 shows a corner of a bonding pad 400 wherein the plurality of open slots and holes include a variety of shapes

401–412. The shapes may include angles 401 and 412, rectangle 402, diamond 403, hexagon 404, T 405, L 406, square 407, cross 408, circle 409, pentagon 410 or triangle 411. Each of the open slots and holes 401–412 extend to the peripheral edge of bonding pad 400. Stated alternatively, each of the open slots and holes 401–412 intersect the peripheral edge of bonding pad 400.

Figure 5:
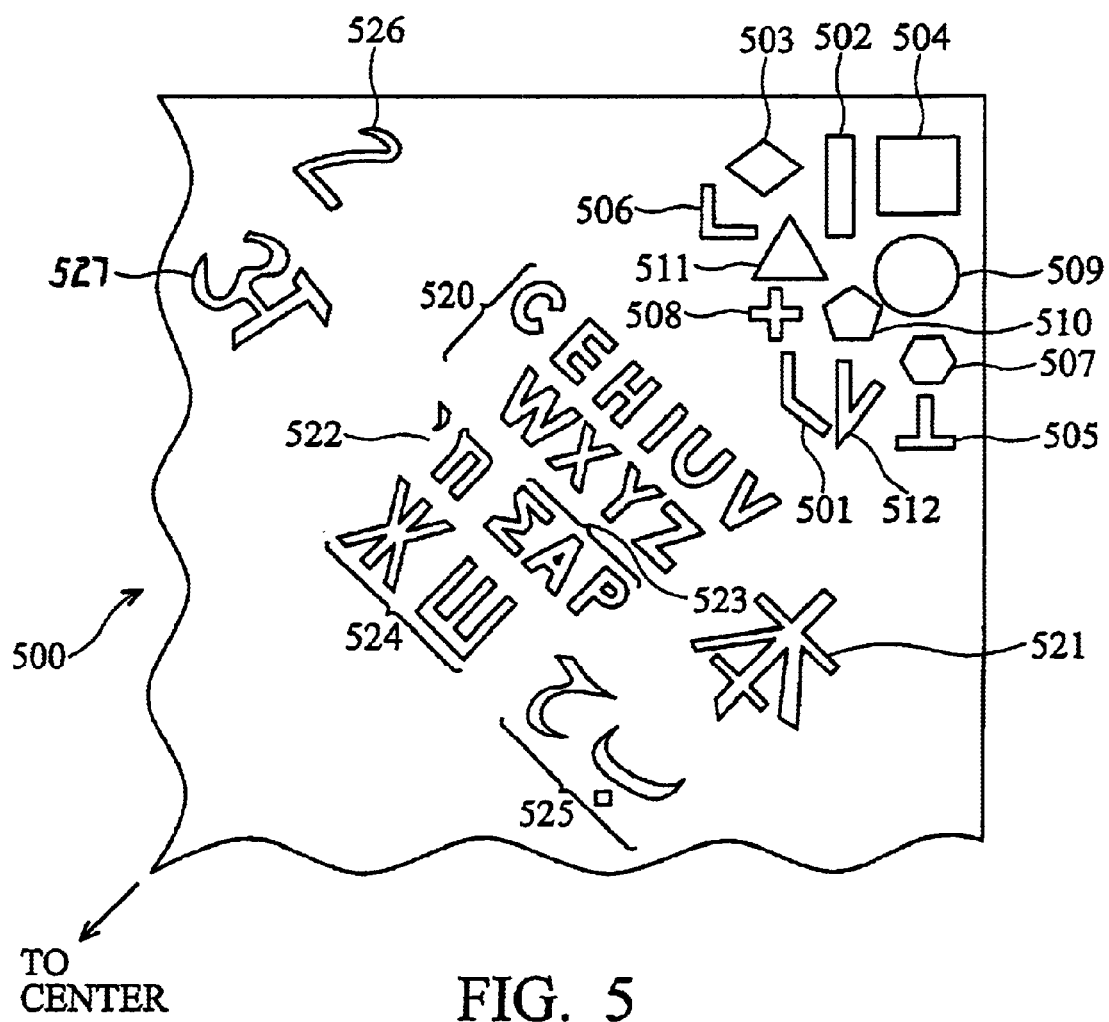

FIG. 5 shows a corner of another bonding pad 500 having a plurality of closed holes fully enclosed by the approximately rectangular metal pattern. The closed holes may include any of a variety of shapes, including angle 501, rectangle 502, diamond 503, square 504, T 505, L 506, hexagon 507, cross 508, circle 509, pentagon 510, triangle 511 and angle 512. A variety of other polygons may be used, including but not limited to those having from three to eight sides. The closed holes may include characters, such as letters of the alphabet 520, Kanji 521, Hebrew characters 522, Greek characters 523, Cyrillic characters 524, Arabic characters 525, Arabic numerals 526, Hindi characters 527, or characters from other languages systems. As shown in FIG. 5, the characters may be oriented at any angle. The characters may have any font.

FIGS. 6–21 show a variety of other shapes for open slots and closed holes.

Figure 6:
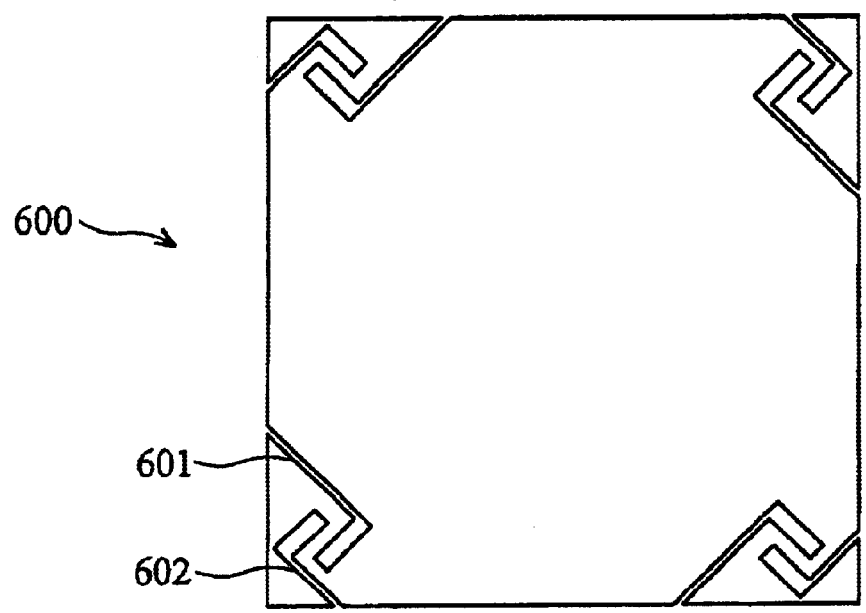

FIG. 6 shows a bonding pad 800 having open slot patterns 601, 602 that may be described as checks, V's or chevrons. These patterns are open to the sides, i.e. they extend to or intersect the peripheral edges, of the bonding pad 600.

Figure 7:
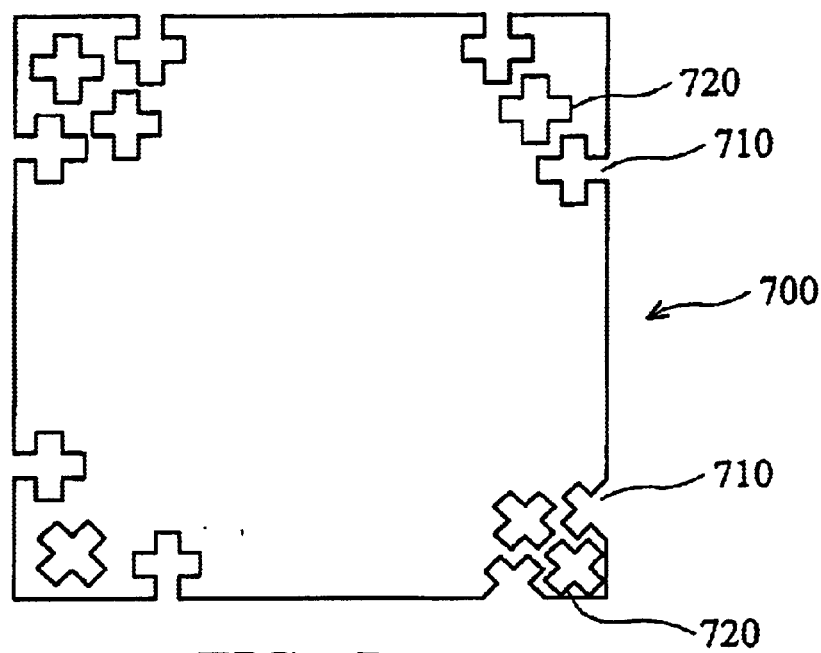

FIG. 7 shows a "hybrid" bonding pad 700 having a plurality of open slots 710 and a plurality of closed holes 720. The slots 710 and holes 720 are both in the shape of crosses. Bonding pad 700 has no axis of symmetry. Each corner is different from the other three.

Figure 8:
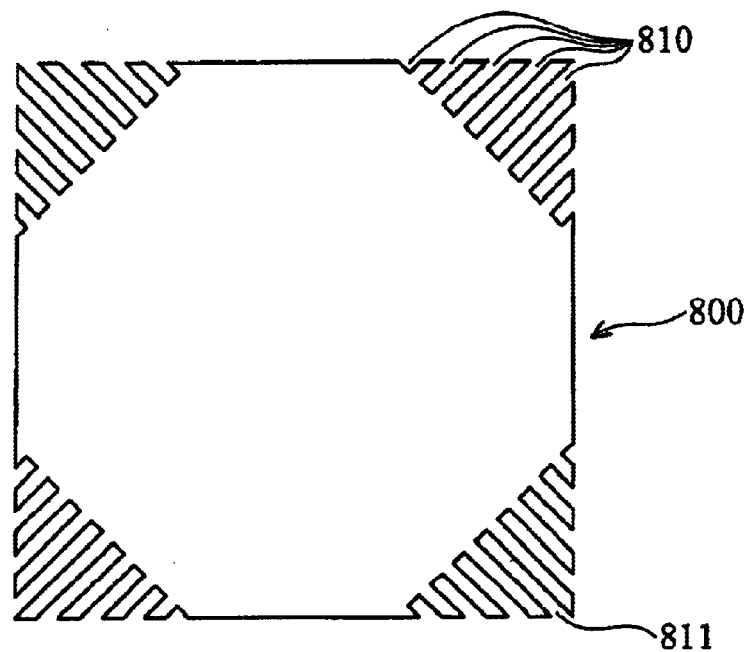

FIG. 8 shows a bonding pad 800 having a plurality of approximately radial patterns 810 that are elongated open slots. The patterns 811 that pass through the corners of the bonding pad are radial, and the remaining patterns are parallel to the corner patterns. FIG. 8 has horizontal, vertical and diagonal axes of symmetry. The slots 810 have respectively different sizes.

Figure 9:
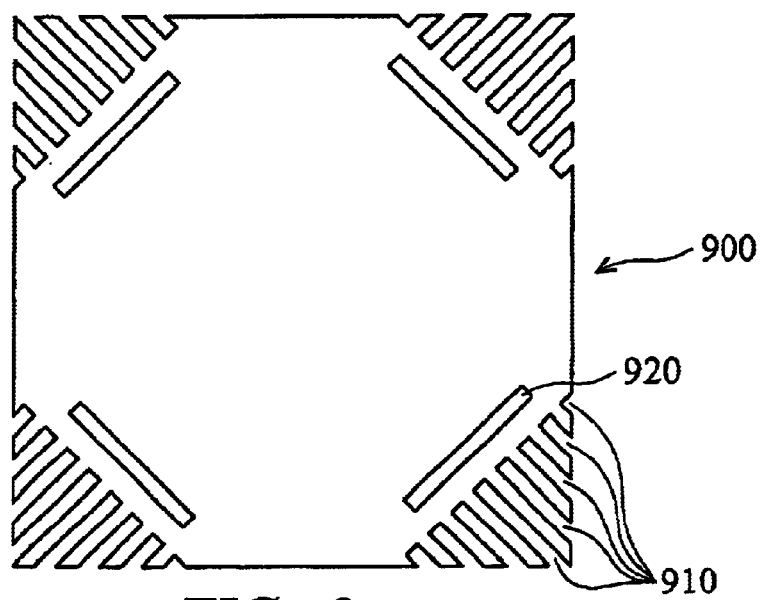

FIG. 9 shows a bonding pad having approximately radial open slot patterns similar to those of FIG. 8, plus additional closed hole patterns 920. Thus, FIG. 9 shows a "hybrid" arrangement with open slots 910 and closed holes 920. FIG. 9 has horizontal, vertical and diagonal axes of symmetry. The slots 910 have respectively different sizes.

Figure 10:
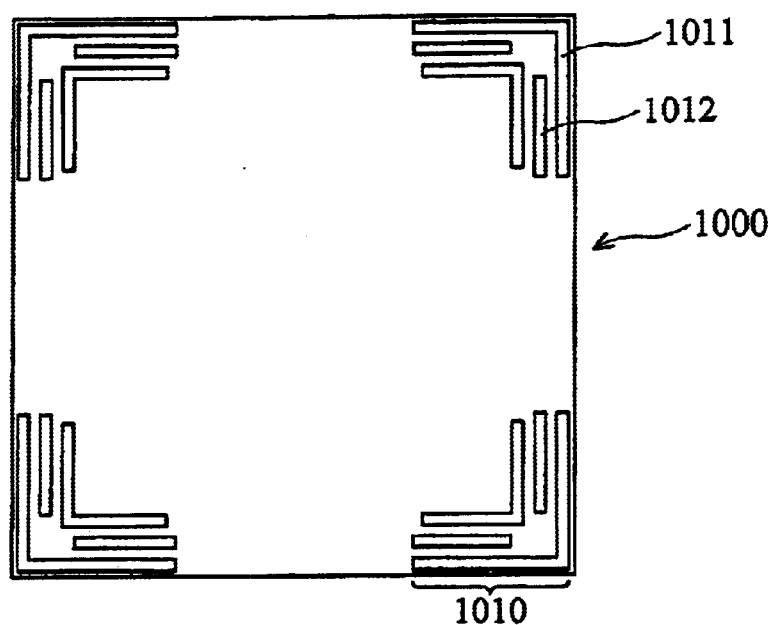

FIG. 10 shows a bonding pad 1000 having a plurality of closed slots 1010. The closed slots 1010 include angles 1011 and straight line segments 1012. The bonding pad 1000 has vertical, horizontal and diagonal axes of symmetry.

Figure 11:
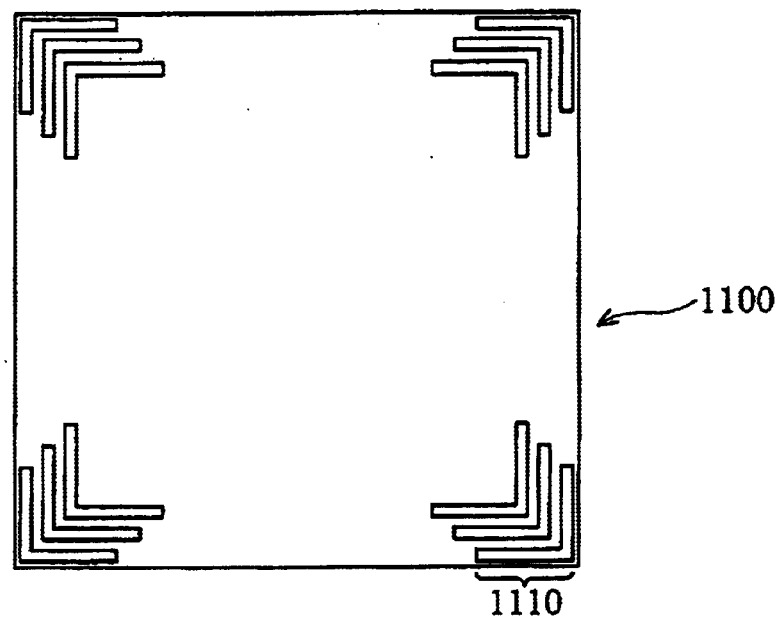

FIG. 11 shows a bonding pad 1100 having a plurality of closed slots 1110. The closed slots 1010 include angles. The bonding pad 1000 has vertical, horizontal and diagonal axes of symmetry.

Figure 12:
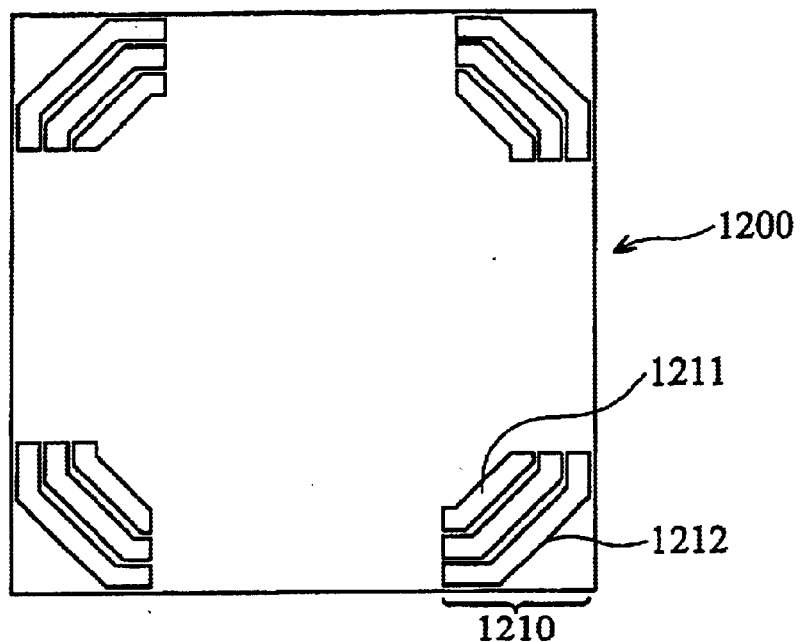

FIG. 12 shows a bonding pad 1200 having a plurality of closed slots 1210. The closed slots 1210 include straight-line segments 1211 and beveled slots 1212. The bonding pad 1200 has vertical, horizontal and diagonal axes of symmetry.

Figure 13:
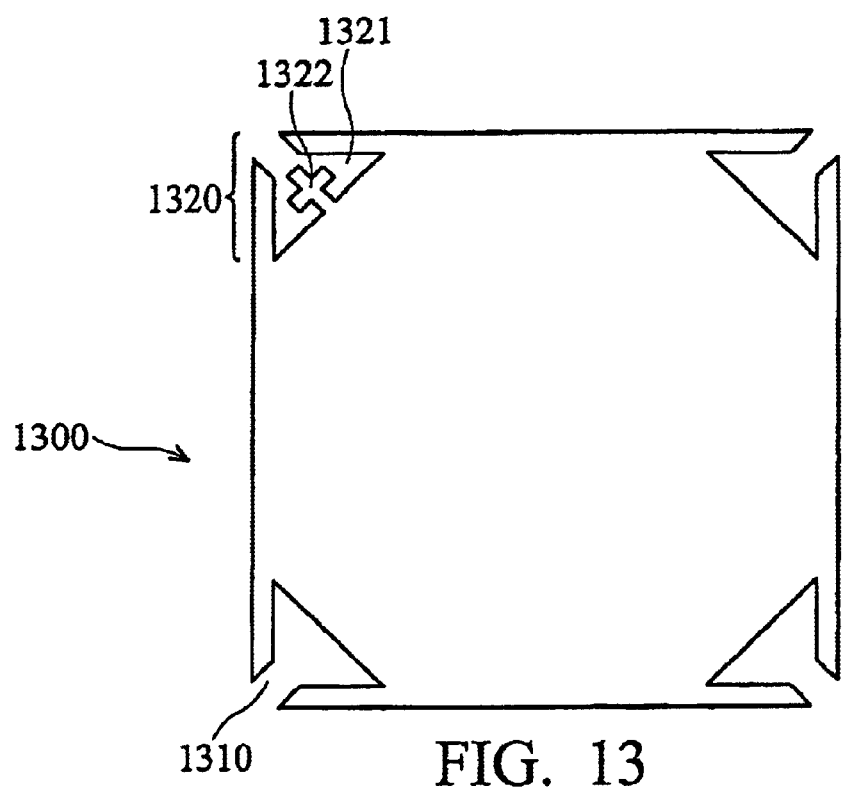

FIG. 13 shows a bonding pad 1300 having a plurality of open holes 1310, of a shape that generally includes an outwardly pointing triangle and an open slot connecting the triangle to a corner of the bonding pad. One of the open holes 1320 also has a dendritic or cross-shaped metal pattern 1322 dividing the triangle portion 1321 of hole 1320. Bonding pad 1300 has one axis of symmetry along a diagonal that bifurcates hole 1320.

Figure 14:
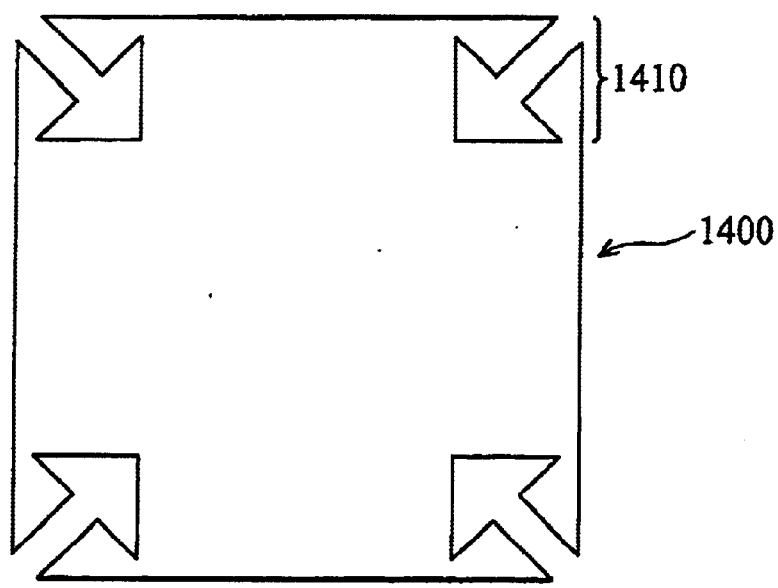

FIG. 14 shows another bonding pad 1400 having a plurality of open holes 140 in the general shape of an inward-pointing arrow. Bonding pad 1400 has axes of symmetry in the horizontal, vertical and diagonal directions.

Figure 15:
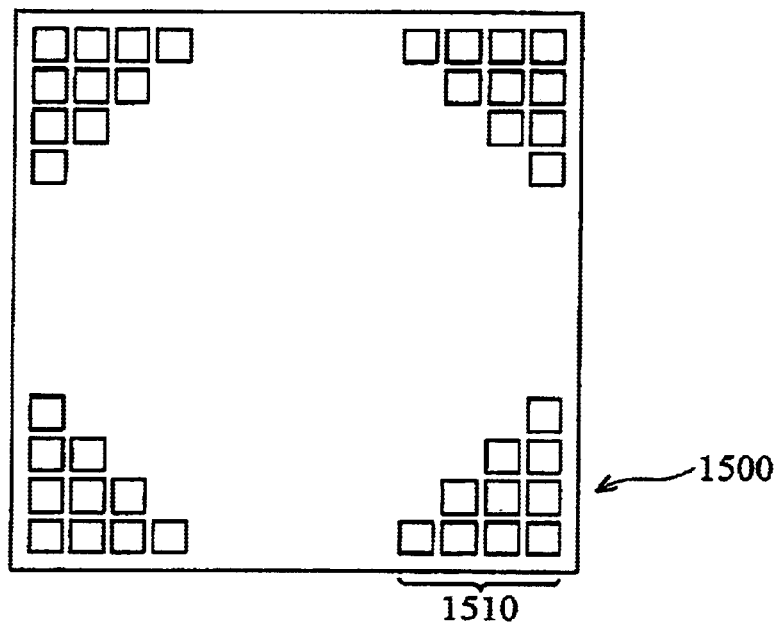

FIG. 15 shows a bonding pad 1500 with a plurality of closed square holes 1510 in each corner. The holes 1510 in each corner are arranged in a generally triangular or bat-wing pattern. Bonding pad 1500 has axes of symmetry in the horizontal, vertical and diagonal directions.

FIG. 16 shows a hybrid bonding pad 1600 having a plurality of open slots or holes 1610 and a plurality of closed slots or holes 1620. The holes and slots are all square or rectangular. Bonding pad 1600 has no axis of symmetry.

Figure 17:
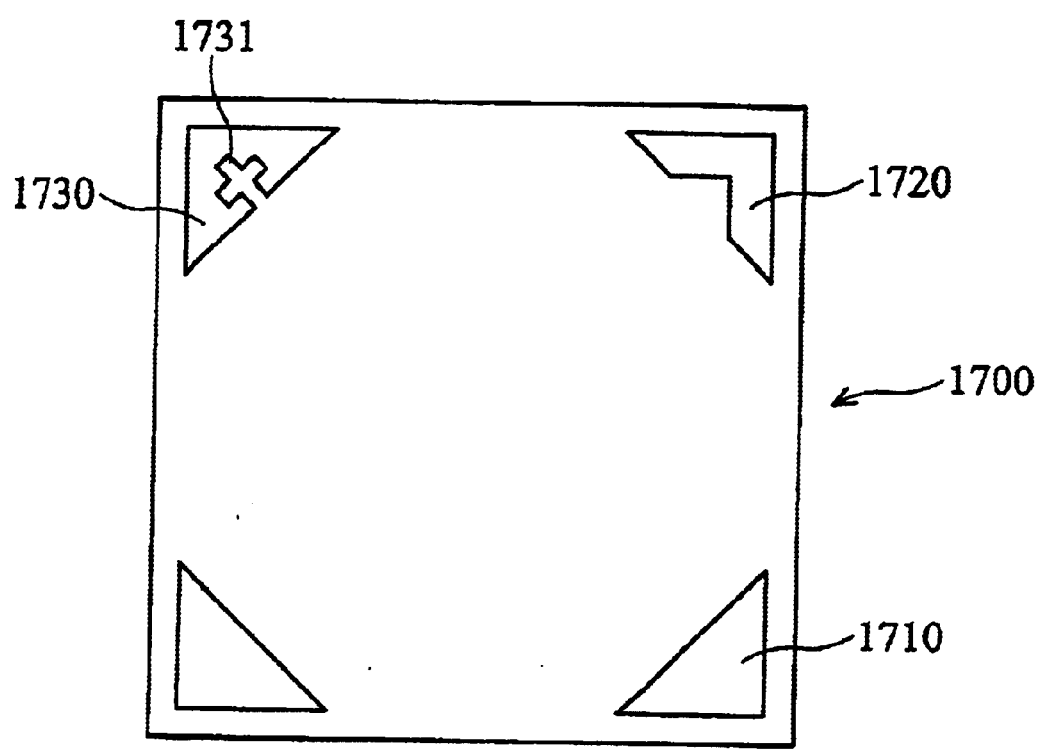

FIG. 17 shows a bonding pad 1700 having a plurality of closed holes 1710, 1720 and 1730. Holes 1710 are triangular. Hole 1720 is chevron shaped. Hole 1730 is shaped like a triangle with the metal extending into the triangle in a dendritic or cross-shape. Bonding pad 1700 has no axis of symmetry.

Figure 18:
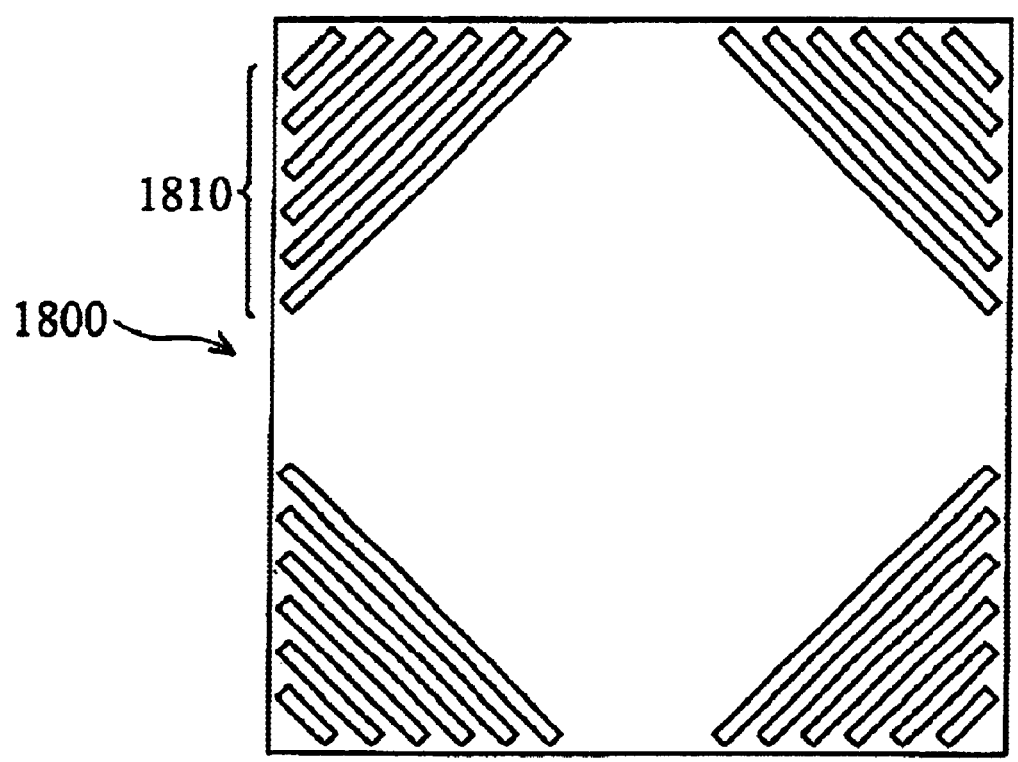

FIG. 18 shows a bonding pad 1800 wherein the plurality of closed slots 1810 are straight-line segments extending in an approximately tangential direction. The center of each slot 1810 is in the tangential direction, i.e., each slot is tangent to a respectively different concentric circle having its center at the center of the bonding pad 1800. Bonding pad 1800 has axes of symmetry in the horizontal, vertical and diagonal directions.

Figure 19:
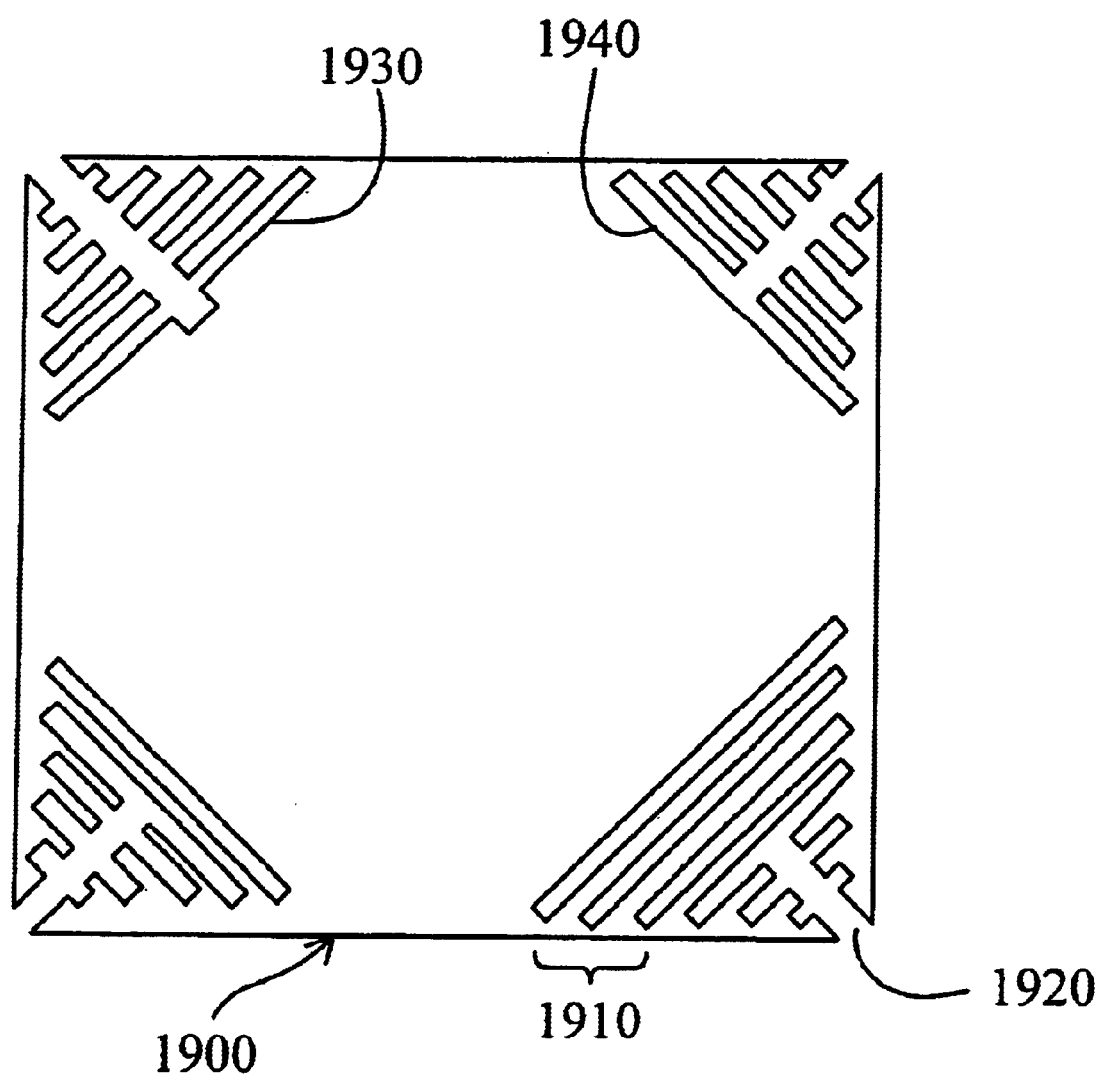

FIG. 19 shows a hybrid bonding pad 1900 wherein each corner has a dendritic open slot pattern extending inward from the corner. Each corner has a slightly different pattern. Two of the corners have completely open patterns 1930 and 1940, with all tangential slots connected to a central radial slot. The remaining two corners include an open dendritic pattern 1920 and at least one closed tangential slot 1910. Bonding pad 1800 has no axis of symmetry.

Figure 20:
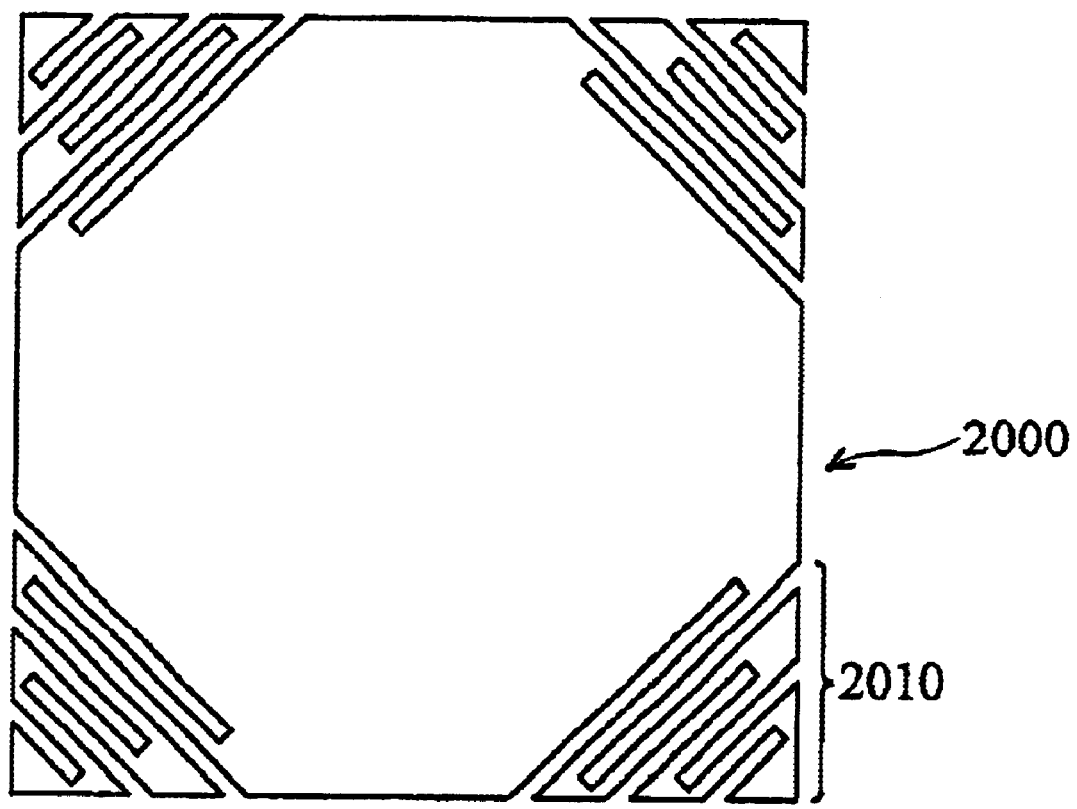

FIG. 20 shows a bonding pad 2000 wherein the plurality of open slots 2010 are straight-line segments extending in an approximately tangential direction. A portion of each slot 2010 at the diagonal axis of the bonding pad 2000 is in the tangential direction, i.e., each slot is tangent to a respectively different concentric circle having its center at the center of the bonding pad 2000. Each corner has the same pattern as the adjacent corner rotated by 90 degrees, but bonding pad 2000 has no axis of symmetry.

Figure 21:
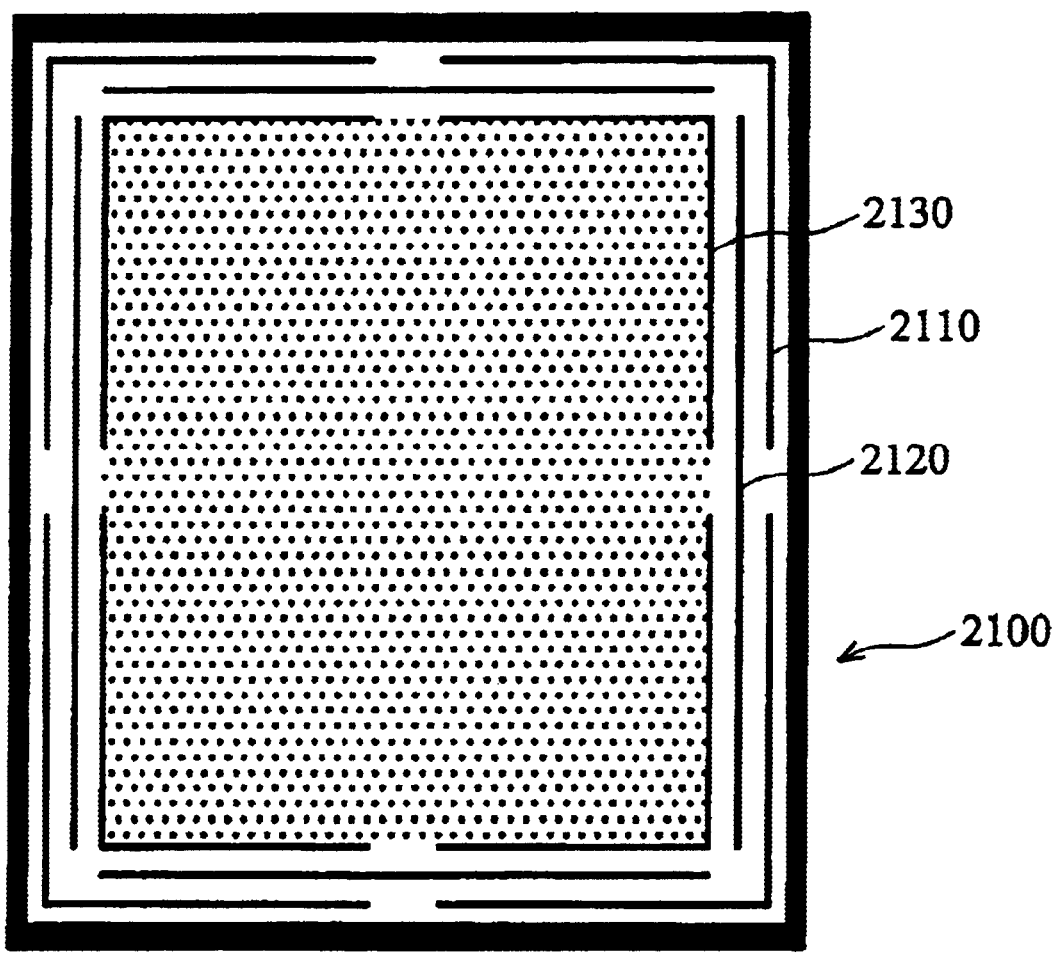

FIG. 21 shows a bonding pad 2100 having closed slots in the form of elongated angles 2110 and 2130 that extend nearly to the center of each side of the bonding pad, and elongated slots 2120 that extend from the center nearly to each corner of the bonding pad 2100. This shows that the patterns can extend to the center of each side.

Although several examples of slots and holes are provided herein, those of ordinary skill in the art may substitute other patterns.

It is believed that the embodiments described herein do not affect electrical performance. In particular, the resistance between the circuit paths in the die and the circuit paths in the package substrate should not be affected. The exemplary embodiments permit the via density and the minimum pitch between vias to remain unchanged.

Bonding pads according to preferred embodiments of the invention may have the same pad size as prior art bonding pads or smaller pad size. Other embodiments of the invention using a larger pad size are also contemplated.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A bonding pad suitable for use in wire banding an integrated circuit, said bonding pad including an approximately rectangular metal pattern having a peripheral edge, said bonding pad having at least one slot or hole therein at or adjacent to at least one corner of the approximately rectangular metal pattern, the slot or hole extending to and intersecting said peripheral edge and providing peeling stress relief.

2. The bonding pad of claim 1, wherein the at least one hole or slot extends from the at least one corner inward towards an interior or center of the bonding pad.

3. The bonding pad of claim 1, wherein the at least one hole or slot has a shape from the group consisting of a square, a triangle, an arrow, a rectangle, a cross, a chevron, an angle, a circle, a pentagon, a diamond, a hexagon, a letter of the alphabet, an Arabic numeral, a Kanji, Cyrillic, Greek, Arabic or Hebrew character, and a polygon.

4. The bonding pad of claim 1, wherein the bonding pad has at least one axis of symmetry.

5. The bonding pad of claim 1, wherein the at least one hole or slot is excluded from a central region of the bonding pad to which a wire bond ball is to be bonded.

6. The bonding pad of claim 1, wherein the at least one hole or slot includes a plurality of holes or slots having respectively different shapes.

7. The bonding pad of claim 1, wherein a dendritic or cross shaped metal pattern extends into the at least one hole.

8. The bonding pad of claim 1, wherein the at least one hole or slot includes a plurality of holes or slots having respectively different sizes.

9. The bonding pad of claim 8, wherein the plurality of holes or slots include a plurality of slots that extend in an approximately radial direction.

10. The bonding pad of claim 8, wherein the plurality of holes or slots include a plurality of slots that extend in an approximately tangential direction.

11. An integrated circuit that includes a bonding pad structure, wherein the bonding pad structure includes an approximately rectangular metal pattern having a peripheral edge, and the bonding pad has at least one slot or hole therein at or adjacent to at least one corner of the approximately rectangular metal pattern, the slot or hole extending to and intersecting said peripheral edge and providing peeling stress relief.

12. The integrated circuit of claim 11, wherein the at least one hole or slot extends from the at least one corner inward towards an interior or center of the bonding pad.

13. The integrated circuit of claim 11, wherein the at least one hole or slot has a shape from the group consisting of a square, a triangle, an arrow, a rectangle, a cross, a chevron, an angle, a circle, a pentagon, a diamond, a hexagon, a letter of the alphabet, an Arabic numeral, a Kanji, Cyrillic, Greek, Arabic or Hebrew character, and a polygon.

14. The integrated circuit of claim 11, wherein the bonding pad has at least one axis of symmetry.

15. The integrated circuit of claim 11, wherein the at least one hole or slot is excluded from a central region of the bonding pad to which a wire bond ball is to be bonded.

16. The integrated circuit of claim 11, wherein the at least one hole or slot includes a plurality of holes or slots having respectively different shapes.

17. The integrated circuit of claim 11, wherein a dendritic or cross shaped metal pattern extends into the at least one hole.

18. The integrated circuit of claim 11, wherein the at least one hole or slot includes a plurality of holes or slots having respectively different sizes.

19. The integrated circuit of claim 18, wherein the plurality of slots extend in an approximately radial direction.

20. The integrated circuit of claim 18, wherein the plurality of slots extend in an approximately tangential direction.

21. A method of forming an integrated circuit package, comprising the steps of:

providing an integrated circuit having a plurality of bonding pads thereon, each of said bonding pads including an approximately rectangular metal pattern with a peripheral edge, said bonding pad having at least one slot or hole therein at or adjacent to at least one corner of the approximately rectangular metal pattern, the slot or hole extending to and intersecting said peripheral edge and providing peeling stress relief; and wire bonding the plurality of bonding pads to a package substrate of the integrated circuit package.

22. The method of claim 21, wherein the at least one hole or slot extends from the at least one corner inward towards an interior or center of the bonding pad.

23. The method of claim 21, wherein the at least one hole or slot has a shape from the group consisting of a square, a triangle, an arrow, a rectangle, a cross, a chevron, an angle, a circle, a pentagon, a diamond, a hexagon, a letter of the alphabet, an Arabic numeral, a Kanji, Cyrillic, Greek, Arabic or Hebrew character, and a polygon.

24. The method of claim 21, wherein the at least one hole or slot includes a plurality of holes or slots having respectively different sizes or shapes.

25. A bonding pad suitable for use in wire bonding an integrated circuit, said bonding pad having an approximately rectangular metal pattern, said bonding pad including at least one hole therein at or adjacent to at least one corner of the approximately rectangular metal pattern, each hole including a further metal pattern extending therein.

26. The bonding pad of claim 25, wherein said further metal pattern is cross shaped or dendritic.

27. The bonding pad of claim 25, wherein said at least one hole comprises a plurality of holes, the plurality of holes having at least one of different sizes and different shapes.

28. The bonding pad of claim 25, wherein the at least one hole or slot is fully enclosed by the approximately rectangular metal pattern.

29. An integrated circuit that includes a bonding pad structure, wherein the bonding pad structure has an approximately rectangular metal pattern, and the bonding pad includes at least one hole therein at or adjacent to at least one corner of the approximately rectangular metal pattern, each hole including a further metal pattern extending therein.

30. The integrated circuit of claim 29, wherein the at least one hole or slot is fully enclosed by the approximately rectangular metal pattern.

31. The integrated circuit of claim 30, wherein the further metal pattern is cross shaped or dendritic.

32. A method of forming an integrated circuit package, comprising:

providing an integrated circuit having a plurality of bonding pads thereon, each of said bonding pads having an approximately rectangular metal pattern and including at least one hole therein at or adjacent to at least one corner of the approximately rectangular metal pattern, the hole including a further metal pattern extending therein; and wire bonding at least one of the plurality of bonding pads to a package substrate of the integrated circuit package.

33. The method of claim 32, wherein said providing includes said further metal pattern being cross shaped or dendritic.

* * * * *

UNITED STATES PATENT AND TRADEMARK OFFICE
CERTIFICATE OF CORRECTION

PATENT NO. : 6,858,944 B2
DATED : February 22, 2005
INVENTOR(S) : Tai-Chun Huang et al.

It is certified that error appears in the above-identified patent and that said Letters Patent is hereby corrected as shown below:

Column 1,
Lines 31-32, under "BACKGROUND OF THE INVENTION", delete "carpeting" and insert -- cratering --.
Line 51, under "SUMMARY OF THE INVENTION", delete "comer" and insert -- corner --.

Column 3,
Lines 8 and 63, delete "comer" and insert -- corner --.
Line 25, delete "800" and insert -- 600 --.

Column 4,
Line 6, delete "comer" and insert -- corner --.

Column 5,
Line 6, delete "banding" and insert -- bonding --.

Signed and Sealed this

Thirtieth Day of August, 2005

JON W. DUDAS
*Director of the United States Patent and Trademark Office*